(12) United States Patent
Berry

(10) Patent No.: US 8,071,451 B2
(45) Date of Patent: Dec. 6, 2011

(54) METHOD OF DOPING SEMICONDUCTORS

(75) Inventor: Ivan L. Berry, Amesbury, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 72 days.

(21) Appl. No.: 12/511,737

(22) Filed: Jul. 29, 2009

(65) Prior Publication Data

US 2011/0027957 A1 Feb. 3, 2011

(51) Int. Cl.
*H01L 21/8236* (2006.01)

(52) U.S. Cl. ........ 438/276; 438/289; 438/308; 438/369; 438/542; 438/549; 438/551; 438/565; 438/795; 438/798

(58) Field of Classification Search .................. 438/276, 438/289, 308, 369, 542, 549, 551, 565, 795, 438/798
See application file for complete search history.

(56) References Cited

U.S. PATENT DOCUMENTS

| | | | |
|---|---|---|---|
| 5,286,340 A | 2/1994 | Yates, Jr. et al. | |
| 5,527,733 A * | 6/1996 | Nishizawa et al. | 438/558 |
| 5,532,185 A * | 7/1996 | Akamine et al. | 438/544 |
| 5,660,682 A | 8/1997 | Zhao et al. | |
| 5,851,909 A * | 12/1998 | Kamiya et al. | 438/567 |
| 6,413,844 B1 | 7/2002 | Beulens et al. | |
| 6,984,552 B2 * | 1/2006 | Machida et al. | 438/166 |
| 2002/0072227 A1 * | 6/2002 | Russell et al. | 438/653 |
| 2003/0077886 A1 * | 4/2003 | Machida et al. | 438/535 |
| 2005/0181566 A1 * | 8/2005 | Machida et al. | 438/301 |
| 2006/0214198 A1 * | 9/2006 | Matsuki et al. | 257/288 |
| 2007/0117382 A1 * | 5/2007 | Koo et al. | 438/677 |
| 2008/0274370 A1 * | 11/2008 | Sugawara et al. | 428/650 |
| 2009/0184398 A1 * | 7/2009 | Choi | 257/615 |

OTHER PUBLICATIONS

"Effect of hydrogen plasma precleaning on the removal of interfacial amorphous layer in the chemical vapor deposition of microcrystalline silicon films on silicon oxide surface", Young-Bai Park and Shi-Woo Rhee, 1996 American Institute of Physics, Apr. 15, 1996, pp. 2219-2221.
"Hydrogen Plasma Etching Technique for Mono-and Multi-crystalline Silicon Wafers", M. Dhamrin, N.H. Ghazali, M.S. Jeon, T. Saitoh and K. Kamisako, IEEE, 2006, pp. 1395-1398.

(Continued)

*Primary Examiner* — Kevin M Picardat
*Assistant Examiner* — Bac Au
(74) *Attorney, Agent, or Firm* — Eschweiler & Associates, LLC

(57) ABSTRACT

A method of doping a semiconductor body is provided herein. In one embodiment, a semiconductor body is exposed to an activated hydrogen gas for a predetermined time period and temperature. The activated hydrogen gas that is configured to react with a surface of a semiconductor body. The activated hydrogen gas breaks existing bonds in the substrate (e.g., silicon-silicon bonds), thereby forming a reactive layer comprising weakened (e.g., silicon-hydrogen (Si—H) bonds, silanol (Si—OH) bonds) and/or dangling bonds (e.g., dangling silicon bonds). The dangling bonds, in addition to the easily broken weakened bonds, comprise reactive sites that extend into one or more surfaces of the semiconductor body. A reactant (e.g., n-type dopant, p-type dopant) may then be introduced to contact the reactive layer of the semiconductor body. The reactant chemically bonds to reactive sites comprised within the reactive layer, thereby resulting in a doped layer within the semiconductor body comprising the reactant.

13 Claims, 11 Drawing Sheets

OTHER PUBLICATIONS

"Reactions of Silica Surfaces with Boron Halides", B.A. Morrow and A. Devi, Chemical Communications, 1971, pp. 1237-1238.

"Phosphorus and hydrogen atoms on the (001) surface of silicon: A comparative scanning tunneling microscopy study of surface species with a single dangling bond", T.C.G. Reusch, N.J. Curson, S.R. Schofield, T. Hallam and M.Y. Simmons, Surface Science 600, Elsevier B.V., 2005, pp. 318-324.

"Inorganic Surface Nanostructuring by Atmospheric Pressure Plasma-Induced Graft Polymerization", Gregory T. Lewis, Gregory R. Nowling, Robert F. Hicks and Yoram Cohen, 2007 American Chemical Society, Langmuir 2007, vol. 23, No. 21, pp. 10756-10764.

"Step structure and surface morphology of hydrogen-terminated silicon: (001) to (114)", A.R. Laracuente and L.J. Whitman, 2003 Elsevier B.V., Surface Science 545 (2003) pp. 70-84.

"Well-Aligned Silicon Nanograss Fabricated by Hydrogen Plasma Dry Etching", Ming-Che Yang, Jiann Shieh, Chiung-Chih Hsu and Tsung-Chieh Cheng, Electrochemical and Solid-State Letters, 8, (2005), pp. C131-C133.

"Very Low Defect Remote Hydrogen Plasma Clean of Si (100) for Homoepitaxy", B. Anthony, T. Hsu, L. Braux, R. Qian, S. Banerjee and A. Tasch, Journal of Electronic Materials, vol. 19, No. 10, 1990, pp. 1027-1032.

* cited by examiner

METHOD OF DOPING SEMICONDUCTORS

FIELD OF THE INVENTION

The present invention relates generally to semiconductor doping, and more specifically to methods for providing a conformal doping to one or more surfaces of a semiconductor body that is substantially independent of physical orientation of the surfaces.

BACKGROUND OF THE INVENTION

Modern day semiconductor devices are typically formed by changing the electrical characteristics of a semiconductor material (e.g., a silicon substrate) through implanting dopants into the bulk of the material. By changing the type and/or concentration of implanted dopants (e.g., n-type dopants, p-type dopants) the current conduction characteristics of a device can be changed. Current conduction occurs by forming free charge carriers (e.g., electrons, holes) in the bulk of the semiconductor material. Through doping the material with impurity dopant atoms (e.g., phosphorus or boron) the number of free charge carriers can be greatly increased resulting in different current conduction characteristics. Semiconductors containing an excess of holes are called p-type devices and semiconductors containing an excess of electrons are called n-type devices.

For example, the simplest semiconductor device is a p-n junction diode comprising a semiconductor surface having two regions, with different dopant types, abutted together (e.g., a p-type material in contact with an n-type material) at a junction. When an electric potential is applied across the junction of the device (i.e., an electric field is present in the bulk of the device) charge carriers (e.g., electrons) freely flow from one region (e.g., the n-type region) to the other region (e.g., the p-type region), where they recombine with opposite charge carriers (e.g., holes) and form a depletion region in the vicinity of the junction.

More complex device topologies, having more sophisticated geometries, may also be formed based upon the basic idea of semiconductor doping. These more complex devices may be formed to provide devices that meet the needs of the modern computing industry.

SUMMARY OF THE INVENTION

The present invention is directed to a method of conformal doping which can provide a doped layer having a thickness and doping concentration that are substantially independent of the physical orientation of an underlying surface (e.g., that can provide the same doping level at the top of a structure as on the sidewalls). In one particular embodiment, a semiconductor body (e.g., a silicon wafer) is exposed to an activated hydrogen gas ($H_2$ gas) for a predetermined time period and temperature. The activated hydrogen gas will react with the surface of the semiconducting body, breaking bonds in the substrate (e.g., silicon-silicon bonds), and forming a reactive layer comprising weakened and/or dangling bonds (e.g., silicon-hydrogen (Si—H) bonds, silanol (Si—OH) bonds, and/or dangling silicon bonds). The dangling bonds, in addition to the easily broken weakened bonds, result in reactive sites that extend into the semiconductor body. A reactant (e.g., n-type dopant, p-type dopant, metal hydride, metal-organic, etc.) may then be introduced (e.g., as a gas phase or as a liquid phase) to contact the reactive layer of the semiconductor body. The reactant chemically bonds to reactive sites comprised within the reactive layer, thereby resulting in a doped layer. Therefore, a doped layer is formed within a semiconductor body that may be substantially independent of the physical orientation of respective surfaces of the semiconductor body.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
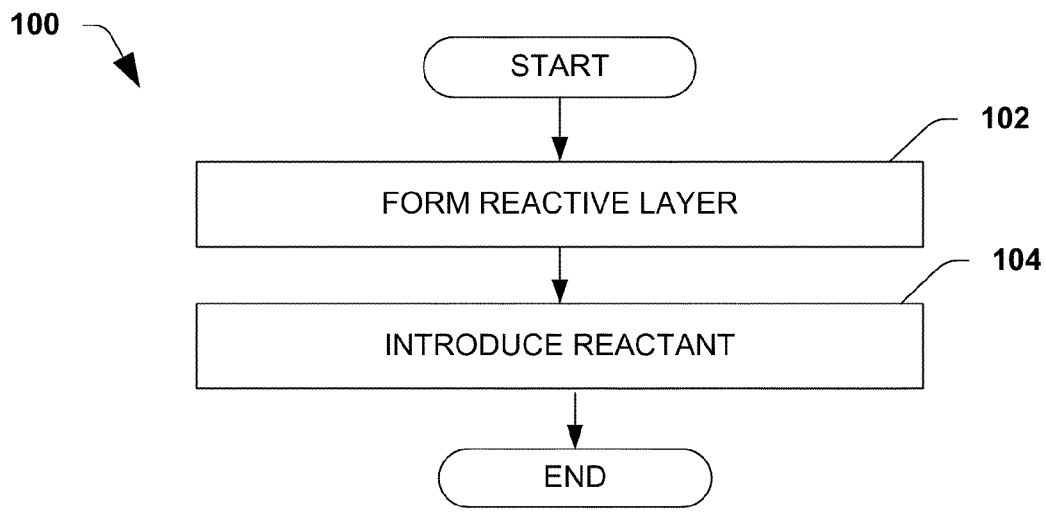
FIG. 1 illustrates a flow diagram of a method for providing a conformal doping to one or more surfaces of a semiconductor body that is substantially independent of the physical orientation of the surfaces.

The present invention will now be described with reference to the drawings wherein like reference numerals are used to refer to like elements throughout.

Performance enhancement of metal-oxide-semiconductor field-effect transistors (MOSFET) devices have traditionally been driven by scaling the physical size of the devices. However, since physical limitations have began to increase the difficulty of traditional scaling of semiconductor circuits, three dimensional devices are emerging as viable alternatives to the commonly used two dimensional devices to optimize surface area and extend device scaling to emerging technology nodes. In particular, three dimensional, multi-gate devices (e.g., tri-gate devices, gate-all-around devices, etc.) are being developed for implementation in the 32 nm technology node, the 22 nm technology node, etc.

Presently in the manufacture of semiconductor devices, ion implantation is the most utilized method to dope semiconductor workpieces (e.g., silicon wafers) with impurities. For example, ion implanters or ion implantation systems may treat a workpiece with an ion beam, to produce n-type or p-type doped regions or to form passivation layers on the workpiece. When used for doping semiconductors, an ion implantation system will usually operate by accelerating dopant species ions provided by an ion source, to a high energy (e.g., between 0.5 to 500 keV). The high energy beam of dopant ions is collided into the surface of a semiconducting substrate resulting in implantation of the energized ions that provides a doped substrate.

Due to the high energy of accelerated ions, dopants implanted by ion implantation are limited to a substantially line-of-sight direction. Therefore, implantation in multiple directions (e.g., of multiple, substantially perpendicular surfaces) can be performed by providing an initial dopant either through implantation or through deposition from a gaseous source, followed by a high temperature thermal diffusion of the dopants. However, such methods result in a number of setbacks including limited dopant concentration (e.g., limited by the concentration of solid solubility), mask thermal stability, and limited control of the dopant concentration. Therefore, to achieve widespread fabrication of high quality multi-gate devices methods of conformal doping of three dimensional devices will have to be improved.

Accordingly, a method of doping a semiconductor body is provided herein. FIG. 1 illustrates a flow diagram of a method 100 for doping of a semiconductor body as provided herein. The method 100 is performed by forming a reactive layer at 102. The reactive layer is configured within about 30 nm of the semiconductor body surface and comprises chemically reactive sites (e.g., dangling bonds). At 104, the reactive layer may be exposed to a reactive element (e.g., dopants) configured to chemically react with (e.g., attach to) reactive sites of the reactive layer, thereby forming a doped semiconductor layer comprising the reactive element.

In a more detailed embodiment, a semiconductor body (e.g., a silicon wafer, a germanium substrate, a silicon-germanium substrate) is exposed to an activated hydrogen gas ($H_2$ gas) for a predetermined time period. The activated hydrogen gas will react with the surface of the semiconducting body, breaking bonds in the substrate (e.g., silicon-silicon bonds, germanium-germanium bonds), and forming a reactive layer comprising weakened (e.g., silicon-hydrogen (Si—H) bonds, silanol (Si—OH) bonds, germanium-hydrogen bonds (Ge—H), germanol bonds (Ge—OH), etc.) and/or dangling bonds (e.g., dangling silicon or germanium bonds). The concentration of the weakened or dangling bonds and the depth to which the bonds penetrate into the surface of the semiconductor body is a function of activated hydrogen concentration, substrate temperature, and the exposure time. The dangling bonds, in addition to the easily broken weakened bonds, result in reactive sites that extend into the semiconductor body. A reactant (e.g., n-type dopant, or p-type dopant, metal hydride, metal-organic, etc.) may then be introduced (e.g., as a gas phase or as a liquid phase) to contact the reactive layer of the semiconductor body. The reactant chemically bonds to reactive sites comprised within the reactive layer, thereby resulting in a doped layer.

In one embodiment, the method provided herein may comprise forming a conformal doped layer comprising a thickness and doping concentration that are substantially independent of the physical orientation of an underlying surface (e.g., that provides the same doping level at the top of a structure as on the sidewalls).

It will be appreciated that the term "conformal doping" is defined herein as a doping, alloying, or other materials modification of a planar and non-planar surface in a way that is substantially independent of the angle of the surface normal and provides the planar and non-planar features with a surface normal angle independent concentration profile (e.g., uniform thickness, etc.) over both the planar and non-planar features. Furthermore, it will be appreciated that the terms "dopant" and "doping layer" may refer to a wide range of doping elements including but not limited to n-type dopants (e.g., boron), p-type dopants (e.g., phosphorus, arsenic), metals (e.g. tungsten, tantalum, titanium, nickel, ruthenium), carbon, etc.

Figure 2:
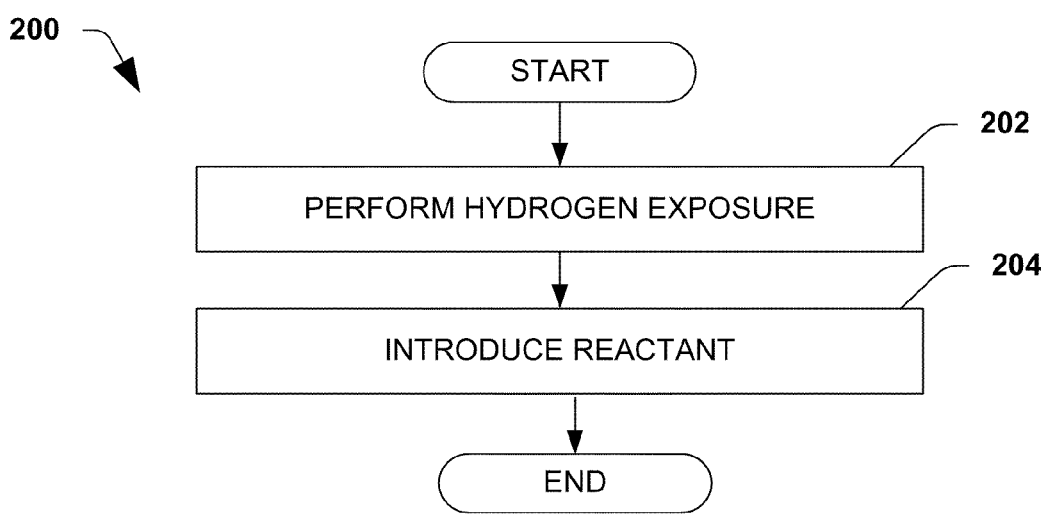
FIG. 2 illustrates a flow diagram of a method for providing a conformal doping to one or more surfaces of a semiconductor body that is substantially independent of the physical orientation of the surfaces.

FIG. 2 illustrates a first exemplary embodiment of a method 200 of doping which can provide a doped layer that extends along one or more surfaces of a semiconductor body. In one embodiment, the doped layer comprises a conformal doped layer which has a thickness and doping concentration that are substantially independent of the physical orientation of the surfaces (e.g., that provides the same doping level at the top of a structure as on the sidewalls). It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 2 begins at 202, wherein a semiconductor body or substrate (e.g., a silicon wafer, germanium substrate) is exposed to an activated hydrogen gas for a predetermined time period at a set temperature or temperature ramp. The activated hydrogen gas may comprise hydrogen ions, atoms and/or molecules in an excited state (e.g., exited atoms from a plasma that are allowed to recombine with electrons, thereby avoiding ionic species), which are configured to react with the semiconductor body and form a reactive layer having chemically reactive sites comprising weakened and/or dangling bonds. For example, in one embodiment, the activated hydrogen gas reacts with a silicon substrate, breaking existing silicon-silicon bonds and forming a reactive layer having chemically reactive sites comprising silicon-hydrogen (Si—H) bonds, silanol (Si—OH) bonds, and/or dangling silicon bonds. It will be appreciated that the semiconductor body, as referred to herein, may comprise any type of semiconductor body (e.g., silicon, germanium, SiGe, SOI) such as a semiconductor wafer or one or more die on a wafer, as well as any other type of semiconductor and/or epitaxial layers formed thereon and/or otherwise associated therewith.

The weakened bonds formed by the activated hydrogen gas can be easily depleted (i.e., broken), thereby providing reactive sites. In one embodiment, the weakened bonds (e.g., silicon-hydrogen bonds, silanol bonds, germanium-hydrogen bonds, germinol bonds, etc.) can subsequently be depleted by a thermal anneal and/or an ultraviolet exposure and/or a plasma exposure. For example, in one embodiment a thermal anneal can be used to break weakened Si—H, Si—OH, Ge—H, or Ge—OH bonds, thereby resulting in additional dangling silicon or germanium bonds (i.e., reactive sites) within the reactive layer.

At 204 a reactant is introduced to the surface of the semiconducting body or substrate. The reactant may be distributed to contact exposed (e.g., unmasked) surfaces of the semiconductor body and to react with the reactive sites comprised within the reactive layer of the semiconductor body. The reaction results in the reactant bonding to the substrate of the semiconductor body (e.g., by chemically bonding to the dangling bonds formed) and thereby results in a doped semiconductor body. Since such a hydrogen-substrate reaction occurs without a highly direction ion bombardment (e.g., from high energy ion implantation), the process provides an inherently isotropic doping that is substantially independent of the orientation of the surface.

In various embodiments, the reactant may be introduced to the surface of the semiconductor body in a gas phase. For example, a boron dopant reactant (e.g., $B_2H_6$, $BCl_3$, or $BF_3$) can be introduced into the atmosphere surrounding in the hydrogen exposed substrate. As stated above, the hydrogen activated substrate presents chemically reactive sites for boron dopant reactant to be incorporated into the substrate. In alternative embodiments, the reactant may be introduced to the surface of the semiconductor body in the liquid phase (e.g., a solution of boric acid and water). In either embodiment, the introduced reactant will be evenly distributed to the reactive sites on unmasked surfaces of the semiconductor body substantially independent of the physical orientation of the surface (e.g., allowing the same doping level to be achieved at a top surface and sidewall surfaces of a structure).

It will be appreciated that the depth and the density of the chemical reactions (e.g., bond breaking) achieved by the activated hydrogen gas can be varied by changing operational parameters of the exposure. For example, the depth and density of the chemical reaction may be a function of the concentration of the activated hydrogen gas (e.g., 50% hydrogen gas, 60% hydrogen gas, etc.), the species of the activated hydrogen gas (e.g., hydrogen ions, atoms, molecules, etc.), the temperature of the activated hydrogen gas, the substrate temperature, and/or the exposure time of a semiconductor body to the activated hydrogen gas. For example, the greater the time a semiconductor body is exposed to an activated hydrogen gas and/or the higher the temperature of the exposure and/or the higher the active hydrogen concentration, the deeper the chemical reaction will extend into the semiconductor body. In general, under typical processing conditions an activated hydrogen gas can be configured to form weakened and/or dangling bonds that extend into a top 10-300 Å of a surface of a semiconductor body.

Furthermore, it will be appreciated that the reactant may comprise various elements or compounds that can be used to satisfy a wide range of applications. For example, in one embodiment, the reactant may comprise an organic gas configured to result in carbon being incorporated to the hydrogen activated reactive sites on the semiconductor body. In alternative embodiments, the dopant element may comprise a dopant species (e.g., boron, phosphorus), thereby allowing the method may be used to dope semiconductor bodies. As will be more fully appreciated below, such embodiments may be useful in the fabrication of multi-gate device (e.g., tri-gate devices, gate-all-around devices, etc.) for evenly doping the various surfaces of the semiconductor body.

In other embodiments, the reactant may comprise a metal (e.g., tungsten (W), tantalum (Ta), titanium (Ti), ruthenium (Ru), palladium (Pd), nickel (Ni), Platinum (Pt), etc.), wherein the metal is incorporated into the substrate. In such embodiments, when the substrate is annealed it may produce a conformal metal silicide, thereby promoting improved contact resistance. In yet another embodiment, the dopant element may be an oxygen or nitrogen containing gas (e.g., $O_2$, $N_2O$, $NH_3$, $N_2$), thereby resulting in the formation of a conformal oxide, nitride, or oxy-nitride structure.

Figure 3:
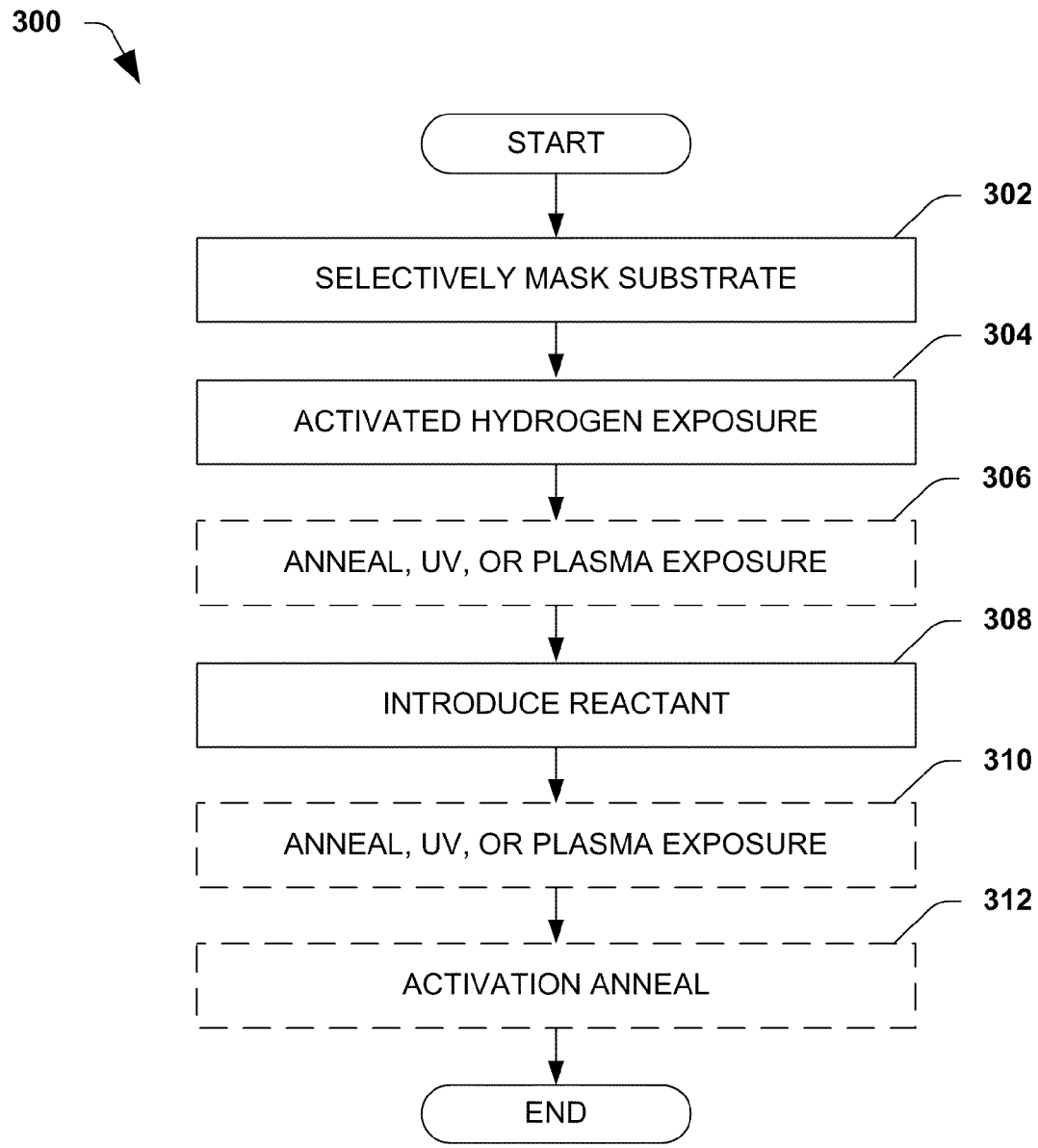
FIG. 3 illustrates a flow diagram of a more detailed method for providing a conformal doping to one or more surfaces of a semiconductor body that is substantially independent of the physical orientation of the surfaces.

FIG. 3 illustrates a flow diagram of a more detailed method 300 for providing a doping to one or more surfaces of a semiconductor body (e.g., a silicon substrate). In one embodiment, the method may provide a conformal doping that is substantially independent of the physical orientation of the surfaces. Furthermore, it will be appreciated that this method 300 may be used for a wide range of applications. For example, in one embodiment, the method 300 may be used to form a conformal doped semiconductor device. The method subjects a semiconductor body to an activated hydrogen gas which reacts with exposed surfaces of the substrate, breaking existing bonds (e.g., Si—Si bond), and forming chemically reactive sites which can subsequently be used to graft a dopant element to exposed surfaces of the semiconductor body.

FIG. 3 begins at 302, wherein a semiconductor body is selectively masked. A masking layer is deposited onto a cleaned semiconductor body. The masking layer can be selectively patterned to define one or more regions that are to be exposed to an activated hydrogen gas (e.g., doped). In one embodiment, the masking layer may comprise a photoresist layer. The photoresist layer may be formed on the substrate by depositing the photoresist onto the substrate and spinning the substrate at a high speed (e.g., 500-3000 RPM) or a sequence of high speeds resulting in an even distribution of photoresist over the surface of the substrate, for example. Photoresist comes in two tones, positive and negative. Positive photoresist will be structurally weakened when it is exposed and negative photoresist will be structurally strengthened when it is exposed.

In an alternative embodiment, the masking layer may comprise a hard mask. The hard mask can be formed above the semiconductor body and may be, for example, around 50 to 500 nm thick. The hard mask may comprise TiAlN, TiN, Ti, $TiO_2$, Al, AlOx, AlN, TiAl, TiAlOx, Ta, TaOx, TaN, Cr, CrN, CrOx, Zr, ZrOx, ZrN, Hf, HfN, HfOx, silicon-rich nitride (SRN), silicon-rich oxynitride (SRON), silicon oxide, low-k dielectric, high-k dielectric, or any stack or combination thereof. An example of a hard mask stack is 300 nm of PECVD deposited $SiO_2$ on 50 nm of sputter deposited TiAlN or TiN.

Figure 4:
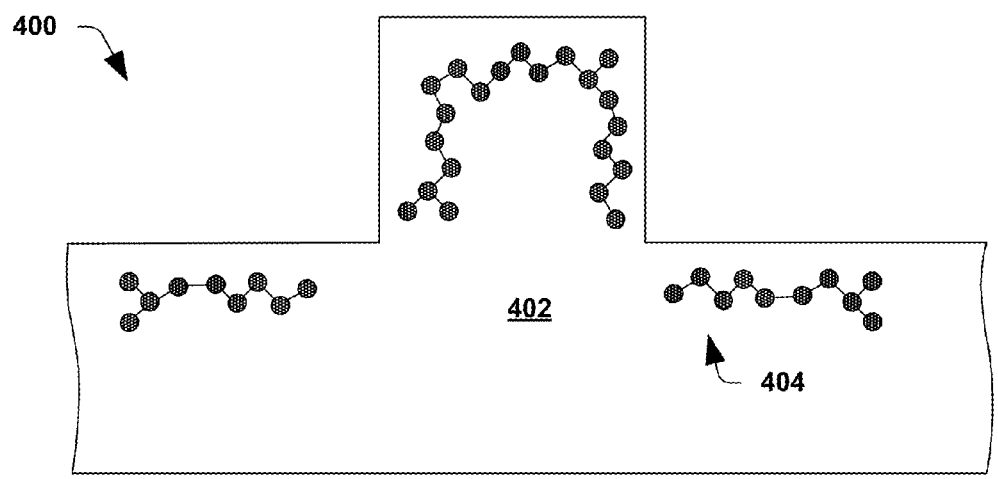
FIGS. 4-6 illustrate cross-sectional views of a semiconductor body according to the method of FIG. 3, wherein an exemplary conformal doping of one or more surfaces of the semiconductor body is performed substantially independent of the physical orientation of the surfaces.

FIG. 4 illustrates a cross sectional view of a semiconductor body prior to processing provided by method 300. As shown in FIG. 4, silicon molecules comprise silicon-silicon bonds 404 that extend along the surface of the semiconductor body. It will be appreciated that the FIGS. 4 to 6 and 10 to 12 are intended only to convey ideas associated with method 300 and are not intended to be physically descriptive of the bonds existing in an actual silicon semiconductor body.

Figure 5:
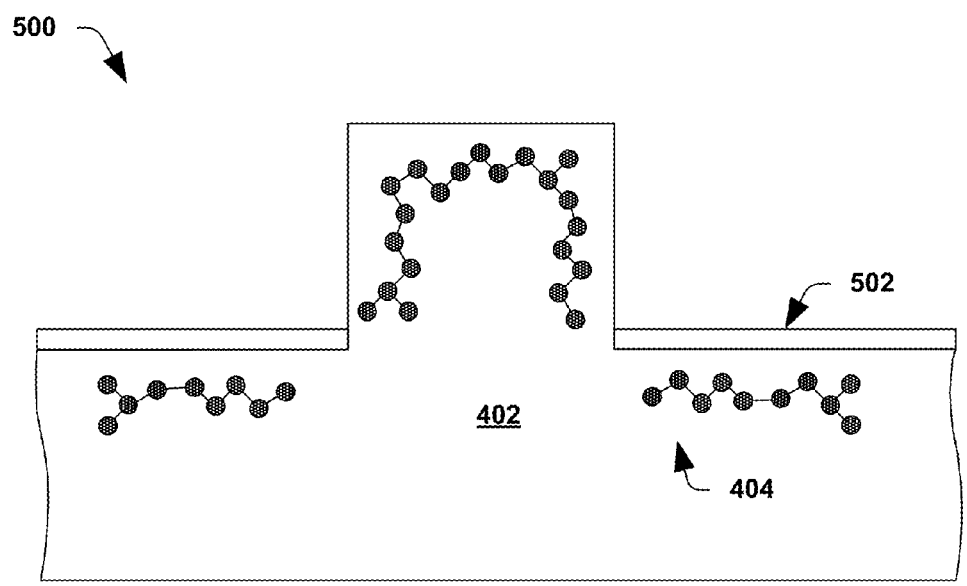

FIG. 5 illustrates a cross sectional view of a semiconductor body 402 comprising a masking layer 502 configured to mask part of the surface of the semiconductor body 402. As shown in FIG. 5 a three dimensional section, comprising a top surface and two sidewall surfaces is left unmasked, so that it can be acted upon by the subsequent method of doping.

At 304 the semiconductor body is exposed to an activated hydrogen gas. The activated hydrogen gas may comprise hydrogen ions, hydrogen atoms, hydrogen radicals, and/or hydrogen molecules in an excited state and/or hydrogen radicals. The activated hydrogen gas is configured to react with the semiconductor body, breaking existing bonds (e.g., silicon-silicon or germanium-germanium bonds), and forming a reactive layer comprising weakened and/or dangling bonds (e.g., Si—H, Si—OH, Ge—H, Ge—OH and Si or Ge dangling bonds).

The activated hydrogen gas may be formed by passing the hydrogen containing gas over a hot filament or by exciting atoms from a plasma and allowing them to recombine with electrons. This results in exited state hydrogen molecules while avoiding ionic species. For deeper reactions, hydrogen ions and excited-state hydrogen atoms may be used as generated by electron-impact dissociation for example. In one particular embodiment, the activated hydrogen gas may be formed from a plasma reaction of a hydrogen containing gas comprising one of more of $H_2$, $NH_3$, $CH_4$, $C_2H_6$, $H_2S$, HF, HCl, $N_2H_4$, HBr. Parameters of the activated hydrogen gas exposure can be adjusted to vary the depth and concentration of the reactive sites comprised within the reactive layer. For example, the depth and density of the bond breaking are a function of the length of time the semiconductor body is exposed to the active hydrogen as well as the concentration and temperature of the activated hydrogen gas. Therefore, while a semiconductor body exposed to active hydrogen for 80 seconds may result in a relatively thin reactive layer thickness (e.g., 5 nm), a semiconductor body exposed to active hydrogen for 300 seconds may result in a substantially thicker reactive layer thickness (e.g., 27.5 nm). In one embodiment, the hydrogen exposure is performed in a gas phase that is at a temperature of 0-600° C. and a pressure between 1 mtorr-760 torr.

Figure 6:
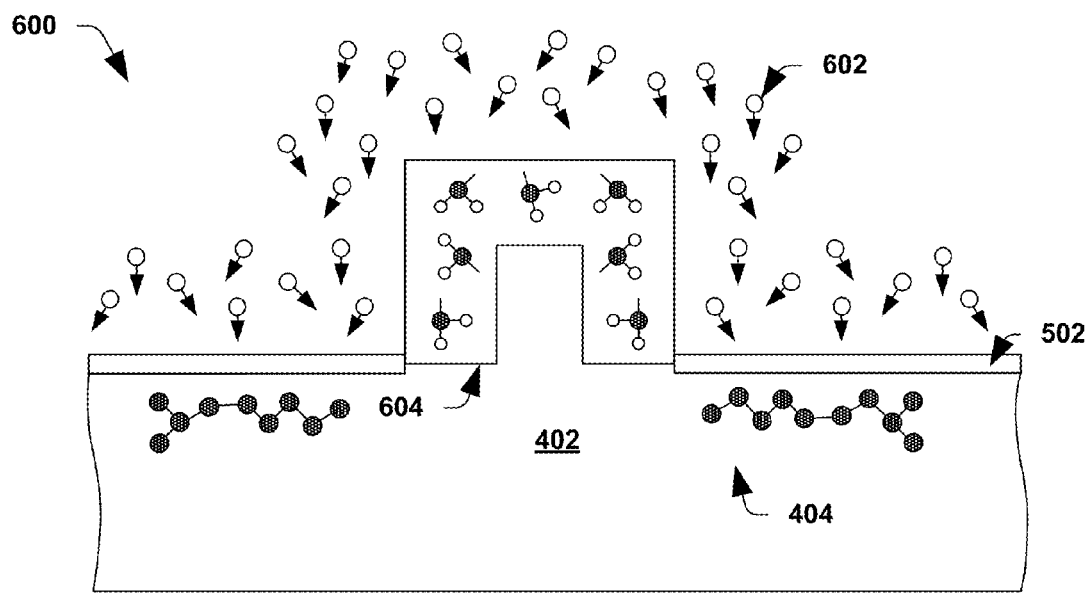

As illustrated in FIG. 6, the activated hydrogen gas 602 interacts with exposed silicon-silicon bonds 404, but does not interact with silicon-silicon bonds 404 that are covered by the masking layer 502. The activated hydrogen gas 602 interacts with the silicon-silicon bonds 404 comprised within the reactive layer 604 of the semiconductor body 402 to generate reactive sites. The reactive layer 604 may extend many monolayers into the semiconductor surface and may be substantially independent of a surfaces orientation.

The reactive hydrogen layer is distinct from oxides typically formed on the surface of the semiconductor body due to physical characteristics such as weight and hydrogen concentration. These physical characteristics are shown in FIGS. 7 and 8 for an exemplary semiconductor body as provided herein.

Figure 7:
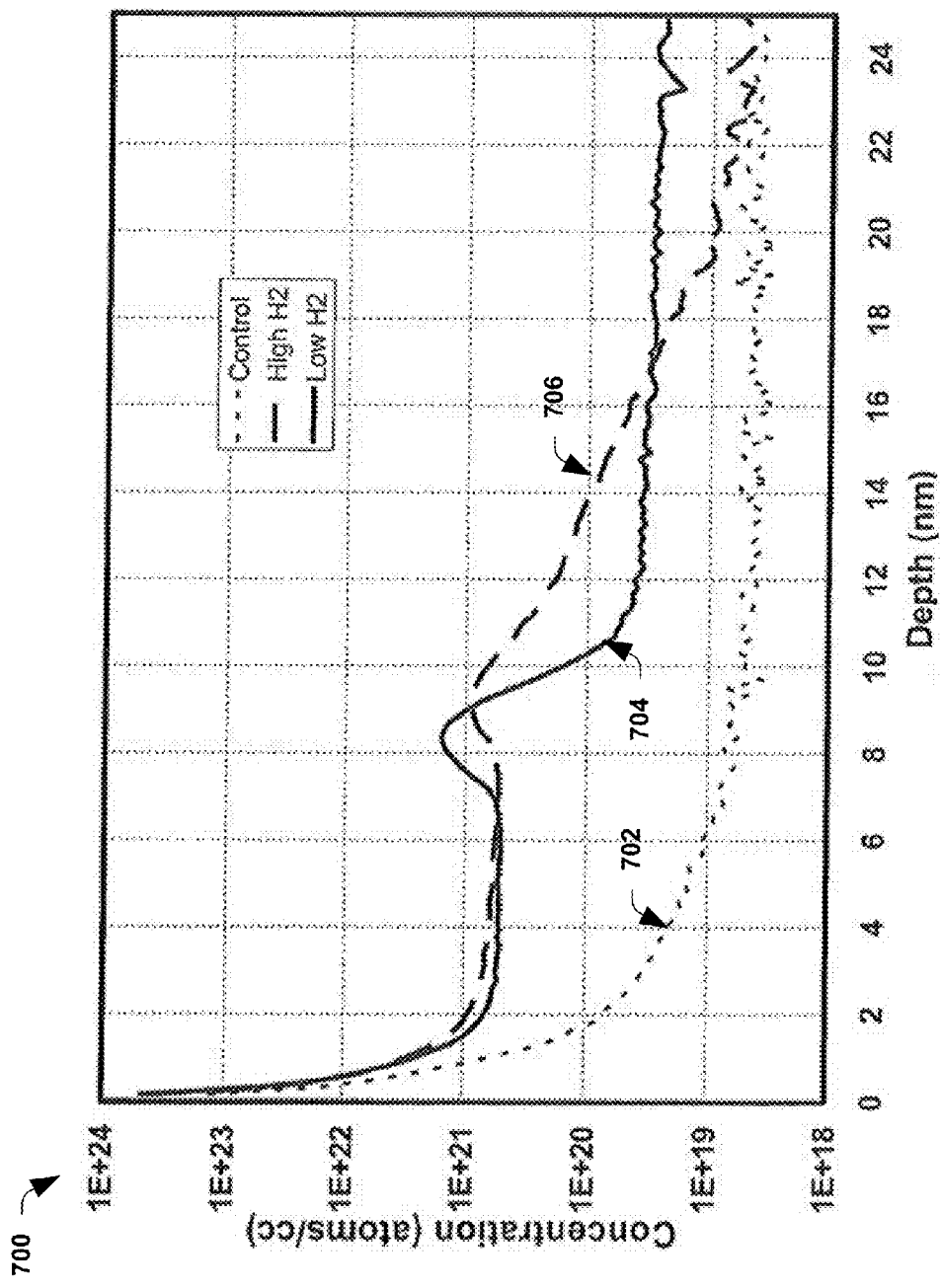
FIG. 7 illustrates a graph showing hydrogen concentration in a semiconductor body as a function of distance from the surface.

For example, FIG. 7 illustrates a graph 700 showing hydrogen concentration in a semiconductor body as a function of distance from the surface. More particularly, the graph 700 illustrates three different secondary ion mass spectroscopy (SIMS) profiles. The x-axis of FIG. 7 illustrates the concentration of hydrogen in atoms/cubic centimeters and the y-axis illustrates the distance from the surface of the semiconductor surface. The first profile 702 illustrates the hydrogen concentration of a control wafer that is not exposed to an activated hydrogen gas. The hydrogen concentration of the first profile 702 decreases exponentially from the surface of the wafer inward. In contrast, the second profile 704 and the third profile 706 illustrate an elevated hydrogen concentration that extends to a depth of approximately 10 nm within the substrate. The second profile 704 illustrates the hydrogen concentration of a substrate exposed to a low concentration of activated hydrogen gas. The third profile 706 illustrates the hydrogen concentration of a wafer exposed to a higher concentration of activated hydrogen gas. The penetration of the activated hydrogen gas into the silicon illustrates that the formation of reactive sites extends into the silicon substrate thereby allowing for dopant atoms to be formed onto the dangling bonds to significant depths. It will be appreciated that while the hydrogen is illustrated in FIG. 7 as extending to approximately 9 nm into the semiconductor body, that it can extend to a different depth (e.g., 1-30 nm) through adjusting parameters of the activated hydrogen gas exposure.

Figure 8:
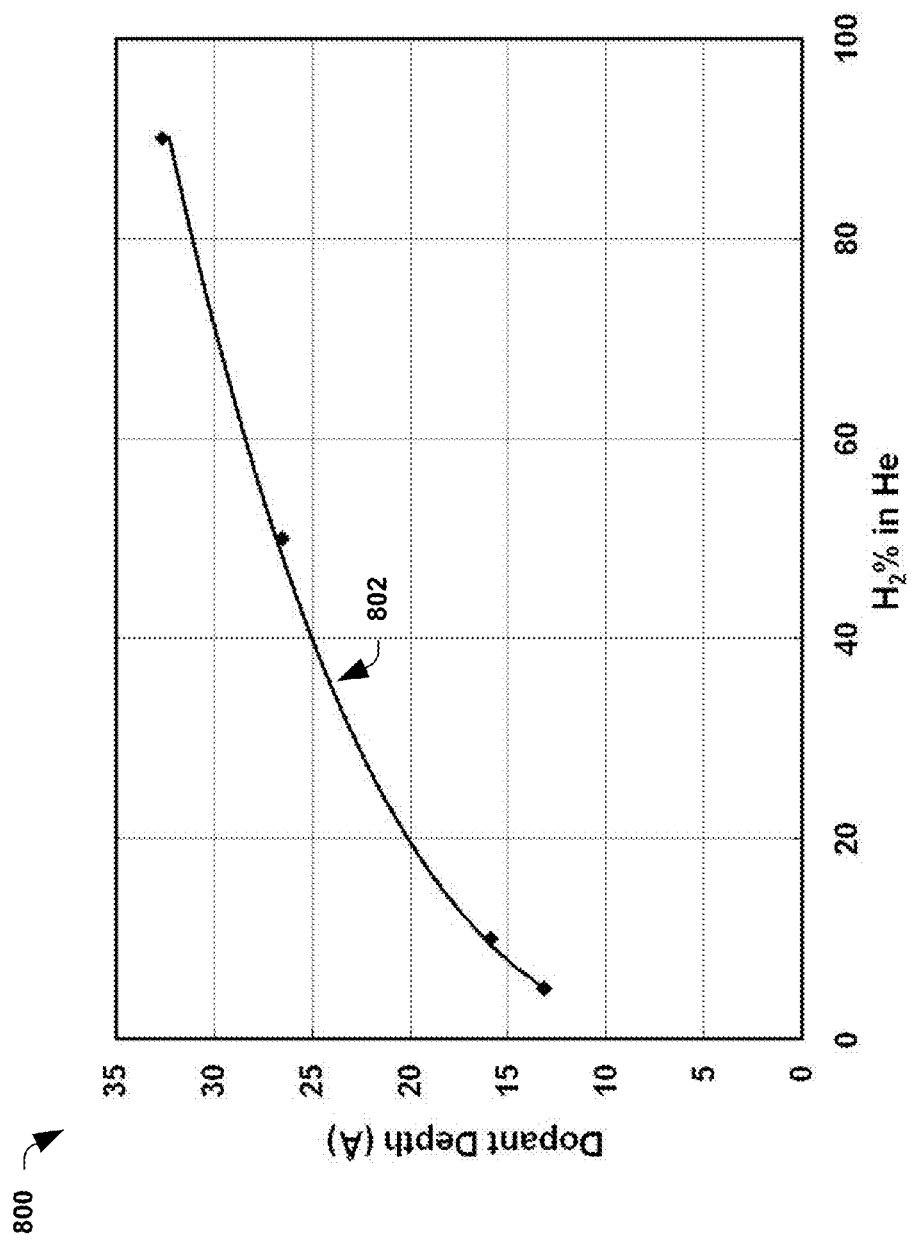
FIG. 8 illustrates a graph showing the depth of the doped layer as a function of the activated hydrogen concentration.

FIG. 8 shows a graph 800 illustrating control of the depth of the dopant distribution by controlling the active hydrogen concentration by diluting it into an inert gas (e.g., helium gas) at a constant time and temperature. The x-axis illustrates the active hydrogen concentration in a helium gas as a percentage. The y-axis illustrates the depth of dopants into the substrate in angstroms. As illustrated in FIG. 8, the depth of the dopant incorporated into the substrate increases as the activated hydrogen gas concentration is increased (e.g., illustrated by trend line 802).

Figure 9:
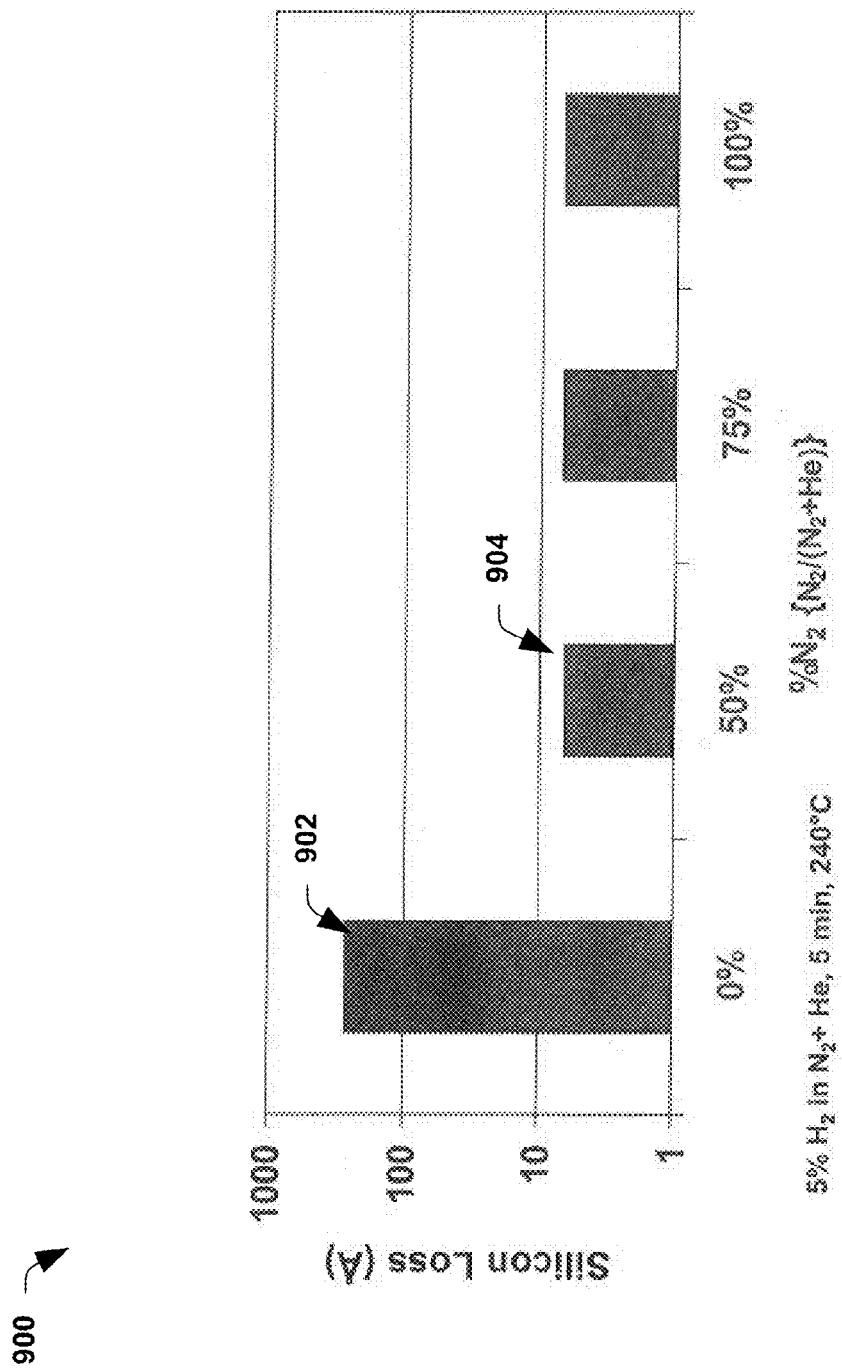
FIG. 9 illustrates a graph showing the effect of introducing a gas additive to an activated hydrogen gas to reduce hydrogen etching of a silicon substrate.

It will be appreciated that the activated hydrogen gas may have an etching effect on the surface of a semiconductor body under certain conditions, thereby resulting in the loss of semiconductor material (e.g., silicon, germanium) from the substrate surface. Therefore, in an alternative embodiment, gas additives may optionally be added to the activated hydrogen gas. The gas additives may be added to help to control the active site formation and/or to reduce damage (e.g., reduce hydrogen etching of silicon) to the surface of the semiconductor body. For example, as shown in FIG. 9, increasing the concentration of $N_2$ gas in an activated hydrogen gas may decrease the effect of hydrogen etching thereby reducing the loss of silicon on the surface of a semiconductor body. More particularly, as shown in FIG. 9, increasing the concentration of nitrogen gas ($N_2$) in an activated hydrogen gas from 0% to 25% results in a decrease of silicon loss (e.g., from hundreds of angstroms of silicon loss to less than 10 angstroms of silicon loss). In alternative embodiments, gas additives that may be inserted to the hydrogen gas may include, but are not limited to, Nitrogen ($N_2$), Ammonia ($NH_3$), Helium (He), Argon (Ar), Neon (Ne), Oxygen ($O_2$), Nitrous oxide ($N_2O$), Carbon dioxide ($CO_2$), and/or Carbon monoxide (CO).

Alternatively, the use of a pulsed plasma source (e.g., a DC generator configured to produce a pulsed plasma) may alternatively used to reduce etching of the semiconductor body or may be used in conjunction with an additive gas to further reduce etching of the semiconductor body.

At 306 and/or 310 a thermal anneal, ultraviolet (UV) exposure, or plasma exposure can be optionally performed on the semiconductor body. The optional thermal anneal, UV exposure, or plasma exposure changes the weakened bond (e.g., Si—H or Si—OH bonds) density. For example, in one embodiment, the optional thermal anneal, UV exposure, or plasma exposure can help to deplete weakened bonds (e.g., Si—H or Si—OH bonds) that have formed in the reactive layer, causing the hydrogen comprised within the weakened bonds to be desorbed, and thereby providing additional dangling bonds for subsequent doping. The optional thermal anneal, UV exposure, or plasma exposure can increase the number of dangling bonds present in the reactive layer, resulting in a higher density of dangling bonds (e.g., and an increased dopant concentration in a subsequent doped layer). Therefore, the optional thermal anneal, UV exposure, or plasma exposure can be used as a control device for dangling bond (e.g., and dopant) concentration in the semiconductor device.

In one embodiment, the optional thermal anneal can be performed using a conventional tube furnace, rapid thermal processor, or laser annealing system. The temperature used for the thermal anneal may vary depending on the bonds formed in the reactive layer of the semiconductor body. For example, in one embodiment, a silicon substrate can be heated to a temperature of between 600° K and 700° K, causing hydrogen from $SiH_2$ species comprised within the reactive layer to be desorbed. In an alternative embodiment, a silicon substrate can be heated to a temperature of between 700° K and 800° K to cause hydrogen to desorb from a SiH species comprised within the reactive layer.

In one alternative embodiment, a UV exposure may result from an exposed semiconductor body being subjected to an ultraviolet illumination source (e.g., a source providing electromagnetic radiation having a wave length between 10 nm and 400 nm). In another alternative embodiment, a plasma exposure may result from an exposed semiconductor body being subjected to a plasma. In yet another alternative embodiment, one or more of the ultraviolet illumination sources and/or plasma exposure may be used in conjunction the thermal anneal to enhance desorption of hydrogen (e.g., breaking Si—H, Si—OH bonds) from the reactive layer. In another alternative embodiment, an ultraviolet illumination source and/or a plasma exposure may be used in place of or in combination with the thermal anneal to desorb hydrogen from the reactive layer.

Figure 10:
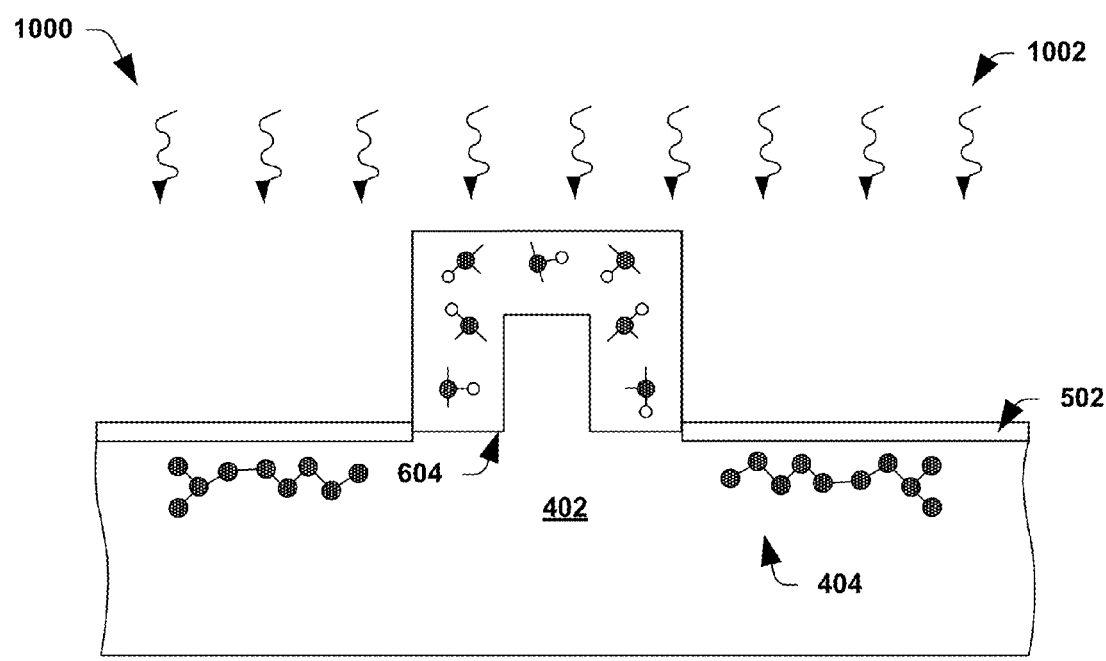
FIGS. 10-12 illustrate cross-sectional views of a semiconductor body according to the method of FIG. 3, wherein an exemplary conformal doping of one or more surfaces of the semiconductor body is performed substantially independent of the physical orientation of the surfaces.

FIG. 10 illustrates a cross sectional view 1000 of the semiconductor body 402 exposed to a thermal anneal 1002. As illustrated in FIG. 10, during exposure of a semiconductor body 402 to an elevated temperature, Si—H and/or Si—OH bonds in the reactive layer 604 will break, thereby providing additional dangling Si bonds in the reactive layer 604 of the semiconductor body.

A reactant is introduced at 308. The reactant is provided to contact the reactive layer in such a manner that it couples to the dangling bonds in the reactive layer, thereby grafting itself to unmasked parts of the semiconductor body. The reactant may comprise one or more elements. In one embodiment, the reactant may comprise an organic polymer configured to graft itself onto the surface of the semiconductor body. In an alternative embodiment, the reactant may comprise dopant atoms (e.g., boron species, phosphorous species) configured to react with the reactive sites to provide a dopant. The dopants may be provided to contact the reactive layer as a gas phase or as a liquid phase dopant. In various embodiments, the gas phase dopants may comprise $B_2H_6$, $BF_3$, $BCl_3$, $PH_3$, $ASH_3$, $AsCl_3$, $AsF_3$, $AsF_5$, $P_2F_4$, $PH_4Cl$, $PCl_2F$, $PClF_2$, $PF_3$, $PCl_3$, $As(OC_2H_5)_3$, etc. Alternatively, the liquid phase dopants may comprise $H_3BO_3$, $H_3PO_4$, POCL, $AsCl_3$, $AsF_3$, $H_3AsO_4$, etc.

In an alternative embodiment, the reactant may comprise a metal configured to react with the reactive sites. The metal reactant may be provided to the reactive layer as a gas phase or a liquid phase. In various embodiments, the gas phase reactants may comprise metal containing gases in the form of a metal hydride, metal carbonyl, metal-organic. Respective metals within the metal containing gases may comprise tungsten, tantalum, titanium, nickel, ruthenium, palladium, platinum, etc.

In one embodiment, the reactant comprises an oxygen or nitrogen containing gas comprising an Oxygen gas ($O_2$), a Nitrogen gas ($N_2$), Ammonia ($NH_3$), Nitrous Oxide ($N_2O$), Carbon Dioxide ($CO_2$), and/or Carbon Monoxide (CO). These reactants may be used to result in the formation of a conformal oxide, nitride, or oxy-nitride structure.

Figure 11:
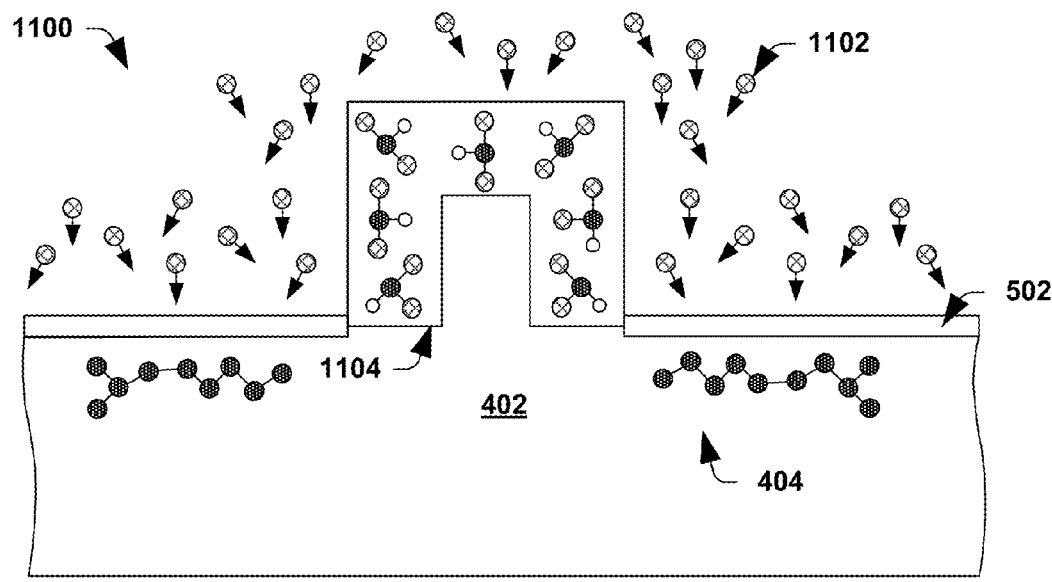

FIG. 11 illustrates a cross sectional view 1100 of the semiconductor body 402 exposed to a dopant gas 1102 (i.e., reactant). As illustrated in FIG. 11, the dopant gas reacts with unmasked sections of the semiconductor body 402, thereby grafting to the exposed dangling bonds of the reactive layer to from a doped layer 1104 comprising dopant atoms coupled to silicon atoms.

It will be appreciated that the method of doping a semiconductor body may vary depending on dopant used. For example, in one embodiment, wherein exposure of a silicon substrate to an activated hydrogen gas results in Si—OH bonds formed in the reactive layer, the silicon substrate can be exposed to a dopant element comprising boric acid (e.g., $BOH_3$). The boric acid may subsequently react with the hydroxyl groups to for Si—O—B linkages, thereby resulting in a doped silicon substrate. Alternatively, other boron compounds such as $BCl_3$, $BF_3$, may also react with the Si—OH bonds comprised within the reactive layer to form a doped layer (e.g., $SiOH+BCl_3 \rightarrow SiOBCl_2+HCl$).

An optional activation anneal is performed at 312. The optional anneal activates the dopants that have been formed in the doped layer (i.e., grafted to the reactive layer dangling bonds). The length of the anneal may vary depending on the process. In one example, the anneal may be performed for one millisecond for a diffusionless anneal.

Therefore, as provided herein, the method 300 of FIG. 3 may provide a doping which can provide a doped layer thickness and doping concentration that are substantially independent of the physical orientation of a surface. It will be appreciated that the inventor has contemplated additional processing steps and/or different processing steps which may occur in addition to the method 500 disclosed herein.

Figure 12:
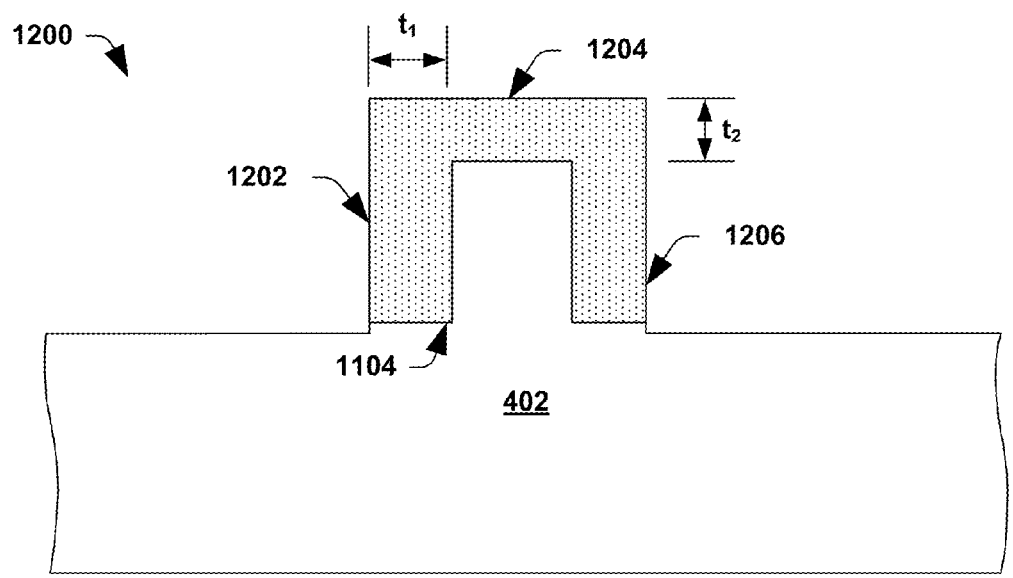

FIG. 12 illustrates a semiconductor body as provided by method 300, comprising a doped silicon layer extending over multiple surfaces of a three-dimensional semiconductor body. As illustrated in FIG. 12, the semiconductor body 1200 comprises multiple surfaces (1202, 1204, 1206), wherein the surfaces are configured to have normal directions that are configured to have substantially different angles. For example, in FIG. 12 a first surface 1202 and a second surface 1204 have normal vectors that are perpendicular to each other. Respective surfaces (1202, 1204, 1206) of the semiconductor body 402 comprise a doped layer 1104. In one embodiment, the thickness of the doped layer on respective surfaces of the semiconductor body may be substantially uniform. For example, in FIG. 12, the thickness, $t_1$, of the doped layer 1104 on the first surface 1202 is substantially equal to the thickness, $t_2$, of the doped layer 1104 on the second surface 1204. In alternative embodiments, the thicknesses, $t_1$ and $t_2$, can be formed to substantially different thicknesses.

It will be appreciated that FIG. 12 illustrates one non-limiting example of a conformal doped semiconductor body provided herein. Other doped semiconductor bodies not provided herein (e.g., having different geometries) have also contemplated by the inventors. For example, although FIG. 12 illustrates the reactive layer as having a substantially constant thickness over the one or more surfaces, it will be appreciated that FIG. 12 is a non-limiting example of a substrate produced by method 300 and in alternative embodiments, method 300 may be configured to provide different doped layer thicknesses on different surfaces of the semiconductor body.

Furthermore, it will be appreciated that method 300 may be performed according to various embodiments and is not to be interpreted in a limiting sense. For example, the method 300 may be performed multiple times upon a single semiconductor body, respective performances of method 300 occurring with different reactants thereby resulting in increased control over the dopant layer (e.g., allowing the formation of a complex dopant layer comprising multiple reactants). For example, in one embodiment, method 300 may be performed a first time with a first reactant and a second time (e.g., immediately following the first application of method 300) with a second reactant. Alternatively, method 300 may be performed multiple times with different hydrogen activations and different reactant exposures to generate differing doping levels at different locations and different depths and concentrations.

In another embodiment, one or more different reactants may be mixed together to provide multiple simultaneous reactions. For example, a reactant may be configured to provide a doping comprising both a phosphorous and arsenic doping.

Figure 13:
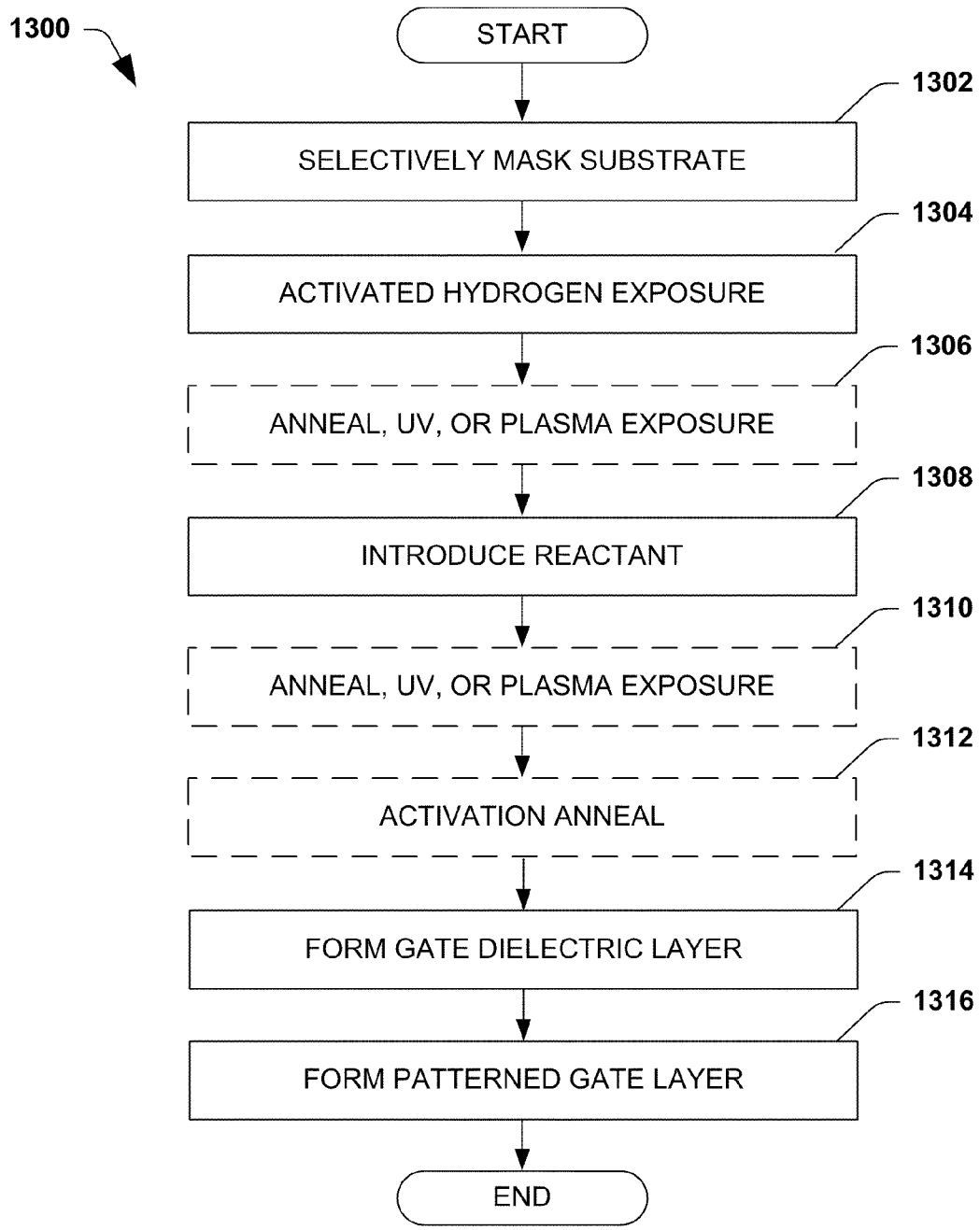
FIG. 13 illustrates a flow diagram of a method for providing a conformal doping to one or more surfaces of a multi-gate semiconductor device that is substantially independent of the physical orientation of the surfaces.

FIG. 13 illustrates a flow diagram of another embodiment of the present invention. FIG. 13 illustrates a method 1300 for providing a doping to one or more surfaces of a multi-gate semiconductor device that may be substantially independent of the physical orientation of the surfaces.

FIG. 13 begins at 1302 wherein a semiconductor body (e.g., silicon substrate, germanium substrate) is selectively masked. A masking layer is deposited onto a cleaned semiconductor body and is configured to define the doping region of the semiconductor device (e.g., leave a channel region of the semiconductor device unmasked so that it can subsequently be exposed to an activated hydrogen gas and dopant).

At 1304 the semiconductor body is exposed to an activated hydrogen gas. As stated above, the activated hydrogen gas may comprise hydrogen ions, hydrogen atoms, hydrogen radicals, hydrogen molecules, and/or hydrogen radicals and is configured to react with the semiconductor body to break existing bonds (e.g., silicon-silicon bonds) and form a reactive layer comprising weakened and/or dangling bonds (e.g., Si—H, Si—OH, and Si dangling bonds).

Figure 14:
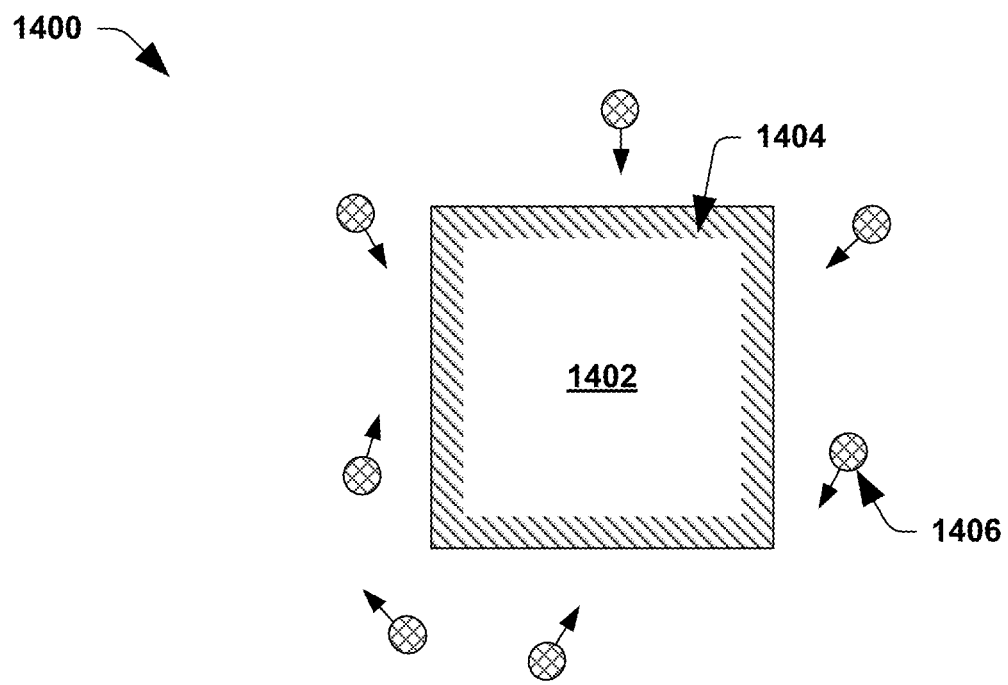
FIG. 14-16 illustrates a top view of a gate-all-around semiconductor device according to the method of FIG. 13, comprising a doped silicon layer extending over all surfaces of the device's conducting silicon channel.

FIG. 14 illustrates a top view 1400 of a gate-all-around semiconductor device exposed to an activated hydrogen gas. The gate-all-around semiconductor device comprises a semiconductor channel region 1402, comprising the semiconductor body, unmasked on all sides. The activated hydrogen gas 1406 reacts with the semiconductor channel region 1402, modifying the surface region and thereby resulting in a reactive region 1404 comprising weakened and dangling bonds. The reactive region 1404 extends along all surfaces of the semiconductor channel region 1402.

A thermal anneal, ultraviolet (UV) exposure, or plasma exposure can be optionally performed on the semiconductor body at 1306 and/or 1310. As stated above, the optional thermal anneal, ultraviolet (UV) exposure, or plasma exposure depletes weakened bonds of the reactive region.

At 1308 a reactant is introduced. The reactant is introduced to the semiconductor body to chemically react with the reactive layer and to form a doped layer. As stated above, the dopant element may be introduced to the semiconductor body as a gas phase or as a liquid phase.

Figure 15:
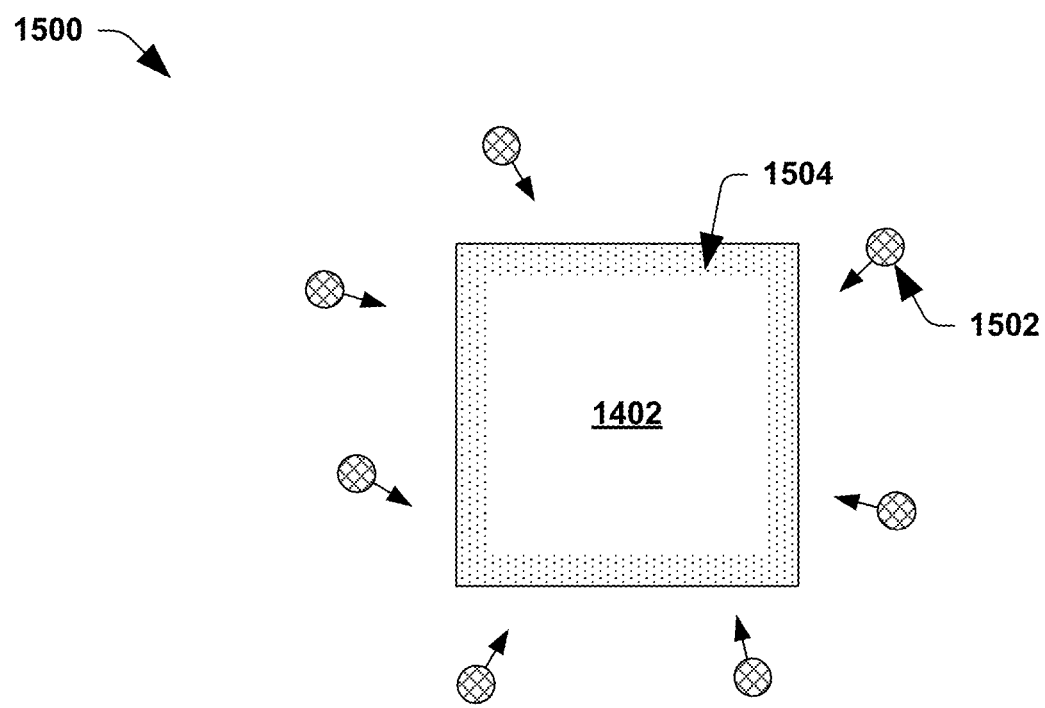

FIG. 15 illustrates a top view 1500 of a gate-all-around semiconductor device exposed to a dopant gas 1502. The dopant gas reacts with the reactive region to form a doped region 1504. The doped region comprises the dopant gas 1502, which has been grafted to the reactive sites of the reactive region.

An optional activation anneal is performed at 1312. As stated above, the optional anneal activates the dopants that have been formed in the doped layer.

At 1314, a gate dielectric layer is formed over the semiconductor body. The gate dielectric layer is comprised of a dielectric material, such as oxide, and is formed with a suitable thickness. The dielectric material can include low-k and/or high-k dielectric materials.

A patterned gate layer is formed over the gate dielectric layer at 1316. The gate layer is comprised of a conductive material, such as polysilicon or a high-k metal gate material (e.g., hafnium dioxide ($HfO_2$), zirconium dioxide ($ZrO_2$) and titanium dioxide ($TiO_2$), and is formed with a suitable thickness. A mask may be formed over the gate layer. The mask is configured to expose certain portions of the gate layer and cover other portions of the gate layer. The mask is typically comprised of a photoresist material, however other masking materials can alternatively be employed. The exposed portions of the gate layer may be patterned and the mask layer may be removed.

Figure 16:
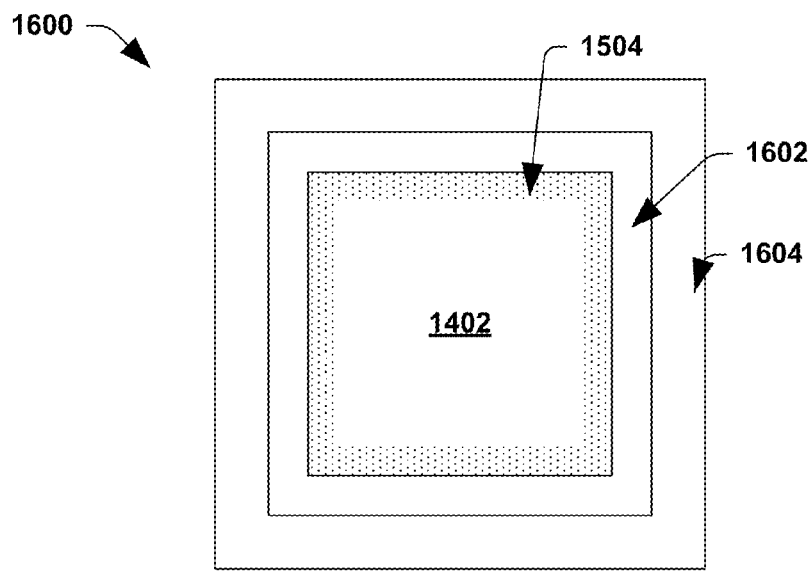

FIG. 16 illustrates a top view of a gate-all-around semiconductor device 1600 comprising a gate oxide layer 1602 and a gate layer 1604. The gate-all-around semiconductor device 1600 comprises a doped silicon layer 1504 (e.g., conformal doped silicon layer) extending over all surfaces of the device's conducting silicon channel 1402. The gate oxide 1602 is configured between the doped layer 1504 and the device's gates 1604 (e.g., polysilicon gates, metal gates) configured around the outer edge of the semiconductor channel region 1402. Therefore, the gate-all-around device 1600 can be formed from according to a single doping process (e.g., as shown in FIG. 13) applied to a single silicon channel 1402.

Figure 17:
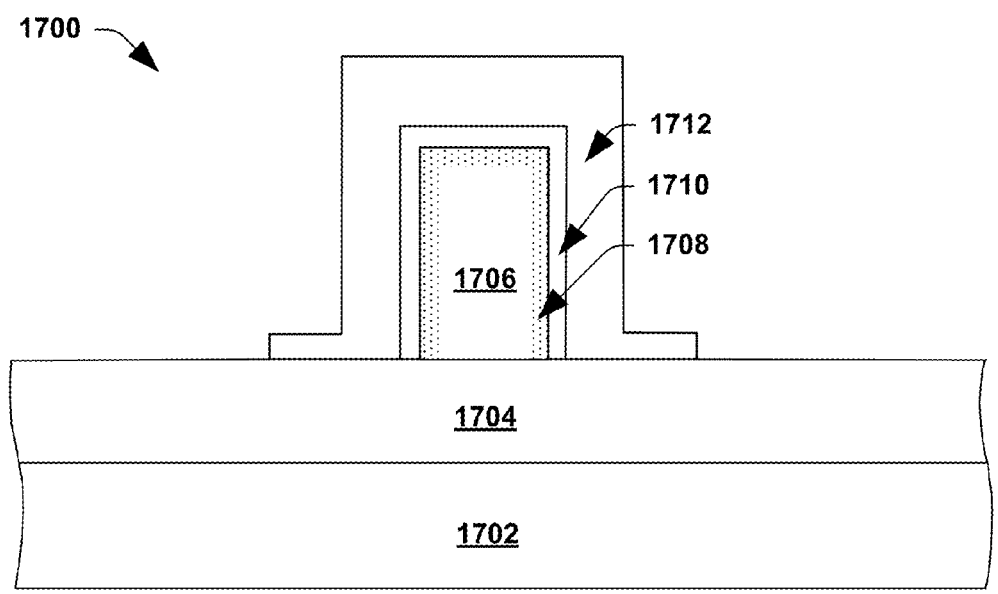
FIG. 17 illustrates a tri-gate semiconductor device comprising a doped silicon layer extending over three surfaces of the device's conducting silicon channel.

In an alternative embodiment, a SOI MOSFET comprising a tri-gate semiconductor device 1700 having a doped silicon layer extending over three surfaces of the device's conducting channel 1706 may also be formed according to method 1300. As illustrated in FIG. 17, the tri-gate semiconductor device 1700 is configured over a buried oxide layer 1704 that is located above a semiconductor body 1702 and comprises a channel region 1706 made of a semiconductor material (i.e., a silicon fin of a finFET device). The device is controlled by three gates 1712 (e.g., doped polysilicon gates), which are configured around three sides of the semiconductor channel region 1706. A thin gate oxide 1710 is configured between the channel region 1706 and the gates 1712. During operation, all three of the gates 1712 can be turned on, causing separate depletion region to form in the semiconductor channel region 1706. As is well known in the art, the multiple gates allow for an enhanced drive current when the device is turned on and a reduction in short channel effects (e.g., leakage current). The semiconductor device as provided in FIG. 17 is configured to have a conformal doped layer 1708 (e.g., n-type doped, p-type doped) extending along the sidewalls and the top of the semiconducting channel region 1706. The thickness and doping concentration of the conformal doped layer 1708 is substantially independent of the orientation of the surface, therefore providing for high quality device characteristics from each of the gates during device operation.

It will be appreciated that alternative embodiments of the devices illustrated in FIGS. 16 and 17, comprising alternative and/or additional layers, configurations, and/or materials, have also been contemplated by the inventors.

Although the invention has been shown and described with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means")

used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. A method of doping a semiconductor body, comprising:
   exposing the semiconductor body to an activated hydrogen gas for a predetermined time, wherein the activated hydrogen gas reacts with one or more surfaces of the semiconductor body to form a reactive layer comprised within the one or more surfaces, and wherein the semiconductor body comprises a silicon, germanium, or silicon-germanium substrate, wherein the reactive layer comprises dangling bonds comprising one or more of: dangling silicon bonds, silicon hydrogen (Si—H) bonds, silanol (Si—OH) bonds, germanium hydrogen (Ge—H) bonds, and germanol (Ge—OH) bonds;
   exposing the semiconductor body to an ultraviolet illumination source or a plasma after exposing the semiconductor body to the activated hydrogen gas, wherein the ultraviolet illumination source or the plasma are configured to change a density of one or more of Si—H, Si—OH, Ge—H, and Ge—OH bonds; and
   exposing the semiconductor body to a reactant comprising an n-type or p-type dopant species, wherein the reactant is configured to chemically react with the dangling bonds within the reactive layer to form a doped layer.

2. The method of claim 1, wherein the doped layer comprises a doping concentration that is substantially independent of a physical orientation of the one or more surfaces.

3. The method of claim 1, wherein a thickness of the doped layer is a function of a concentration of the activated hydrogen gas, a species of the activated hydrogen gas, a temperature of the activated hydrogen gas, a substrate temperature, or the predetermined time.

4. The method of claim 1, further comprising:
   depositing a masking layer onto the one or more surfaces of the semiconductor body;
   selectively patterning the deposited masking layer to define a region for formation of the doped layer prior to exposing the semiconductor body to the activated hydrogen gas and the reactant; and
   removing the masking layer from the one or more surfaces of the semiconductor body after exposing the region to the reactant.

5. The method of claim 1, further comprising performing an anneal to activate the n-type or p-type dopant species in the doped layer.

6. The method of claim 1, the activated hydrogen gas comprising an additive gas configured to control hydrogen etching or active site formation, wherein the additive gas comprises one or more of: Nitrogen gas ($N_2$), Nitrous Oxide ($N_2O$), Ammonia ($NH_3$), Helium (He), Neon (Ne), Argon (Ar), Carbon Dioxide ($CO_2$), Carbon Monoxide (CO), Nitrous Oxide ($N_2O$), or Oxygen gas ($O_2$).

7. The method of claim 1, wherein the reactant is introduced as a gas phase comprising one of: $B_2H_6$, $BF_3$, $BCl_3$, $PH_3$, $AsCl_3$, $AsF_3$, $AsF_5$, $P_2F_4$, $PH_4Cl$, $PCl_2F$, $PClF_2$, $PF_3$, $PCl_3$, $As(OC_2H_5)_3$, or $AsH_3$.

8. The method of claim 1, wherein the reactant is introduced as a liquid phase comprising one of: $H_3BO_3$, $H_3PO_4$, POCL, $AsCl_3$, $AsF_3$, or $H_3AsO_4$.

9. A method of claim 1, wherein the activated hydrogen gas is formed by a plasma reaction of a hydrogen containing gas comprising one of more of: $H_2$, $NH_3$, $CH_4$, $C_2H_6$, $H_2S$, HF, HCl, $N_2H_4$, HBr.

10. A method of forming a multi-gate semiconductor device, comprising:
    selectively masking a silicon, germanium or silicon-germanium substrate to expose a doping region of the multi-gate semiconductor device;
    exposing the exposed doping region of the substrate to an activated hydrogen gas for a predetermined time, wherein the activated hydrogen gas reacts with one or more surfaces of the substrate to form a reactive layer comprising dangling silicon bonds, dangling germanium bonds, silicon hydrogen (Si—H) bonds, silanol (Si—OH) bonds, germanium hydrogen (Ge—H) bonds, or germanol (Ge—OH) bonds, the reactive layer comprised within the one or more surfaces;
    exposing the substrate to an ultraviolet illumination source or a plasma after exposing the substrate to the activated hydrogen gas, wherein the ultraviolet illumination source or the plasma are configured to change a density of Si—H, Si—OH, Ge—H or Ge—OH bonds;
    exposing the exposed doping region of the substrate to a reactant, wherein the reactant is configured to chemically react with the reactive layer to form a doped layer comprising one or more elements of the reactant;
    forming a gate layer extending above the one or more surfaces of the substrate; and
    forming a gate oxide layer configured between the gate layer and the reactive layer.

11. The method of claim 10, further comprising performing an anneal to activate the reactant comprised within the doped layer.

12. The method of claim 10, comprising including an additive gas to the activated hydrogen gas to control hydrogen etching or active site formation.

13. The method of claim 10, wherein the substrate comprises a three-dimensional substrate comprising respective surfaces having normal vectors that are configured to have substantially different angles, and wherein the doped layer is formed to provide a substantially uniform concentration profile within the one or more surfaces that is substantially independent of an angle of respective normal vectors.

* * * * *